United States Patent [19]
Davis et al.

[11] Patent Number: 5,418,474
[45] Date of Patent: May 23, 1995

[54] CIRCUIT FOR REDUCING TRANSIENT SIMULTANEOUS CONDUCTION

[75] Inventors: Jeffrey B. Davis, Raymond; Jay R. Chapin, South Portland, both of Me.

[73] Assignee: National Semiconductor Corporation, Santa Clara, Calif.

[21] Appl. No.: 126,914

[22] Filed: Sep. 24, 1993

[51] Int. Cl.⁶ .............................................. H03K 17/16
[52] U.S. Cl. ..................................... 326/27; 326/81
[58] Field of Search ................. 307/443, 451, 475, 263

[56] References Cited

U.S. PATENT DOCUMENTS

| | | | |
|---|---|---|---|
| 4,818,401 | 4/1989 | Young et al. | 307/451 |
| 5,036,222 | 7/1991 | Davis | 307/443 |
| 5,220,209 | 6/1993 | Seymour | 307/443 |
| 5,280,203 | 1/1994 | Hung et al. | 307/443 X |
| 5,300,832 | 4/1994 | Rogers | 307/475 |
| 5,315,173 | 5/1994 | Lee et al. | 307/263 X |

FOREIGN PATENT DOCUMENTS

| | | |
|---|---|---|
| 0443435 | 8/1991 | European Pat. Off. |
| 0509489 | 10/1992 | European Pat. Off. |

*Primary Examiner*—David R. Hudspeth
*Attorney, Agent, or Firm*—Chris A. Caseiro; Thomas L. Bohan

[57] ABSTRACT

A transient-eliminating circuit for minimizing simultaneous conduction through the pullup and pulldown transistors of a buffer circuit. In a buffer circuit used to translate logic signals from circuits supplied by one high-potential power rail to circuits supplied by another high-potential power rail, in which the potentials of the two high-potential rails are not equal, the transient-eliminating circuit is coupled between the output stage and the input stage in such a way that the translator can be utilized independent of power-up sequencing and without any static current $I_{CCt}$. The transient-eliminating circuit minimizes simultaneous conduction through the pullup and pulldown transistors of the translator by delaying the turn-on of the pulldown transistor until the pullup transistor is completely off. This is achieved in the preferred embodiment of the invention by coupling an NMOS transistor to the output of the translator circuit to act as an early pulldown on the output by using that NMOS transistor to control a PMOS transistor which is in turn used to control the pulldown transistor. A second NMOS transistor of the transient-eliminating circuit also acts to control the pulldown transistor by operating in the reverse mode of the first NMOS transistor so as to ensure that the NMOS transistor is completely off when required.

16 Claims, 2 Drawing Sheets

CIRCUIT FOR REDUCING TRANSIENT SIMULTANEOUS CONDUCTION

CROSS REFERENCE TO RELATED APPLICATION

This invention is related to pending U.S. patent application Ser. No. 08/116,920, filed for an invention entitled $V_{CC}$ TRANSLATOR CIRCUIT on Sep. 7, 1993, and assigned to the same Assignee.

BACKGROUND OF THE INVENTION

1. Field of the Invention

The present invention relates to a circuit that eliminates transient simultaneous conduction current at the output of a dual-potential-interface-buffer circuit-generally described as a power-rail translator-operating independently of the sequencing of the respective high-potential power rails and without significant power losses in the system. More particularly, the present invention is directed to a circuit that completely turns off the pullup transistor of the buffer circuit before turning on the pulldown transistor so as to prevent simultaneous conduction through those two transistors. Even more particularly, the present invention acts to delay the turn-on of the pulldown transistor during the transition from logic-high to logic-low at the output of the translator.

2. Description of the Prior Art

As detailed in the related application of Yarbrough and Chapin, recent advances in integrated circuits—particularly in the field of small computer devices such as laptop and handheld computers—have led to the need for translator circuits used to make the transition from circuitry powered by a particular high-potential power rail to circuitry powered by a different high-potential power rail. These translators direct logic signals from transistors operating at one logic-level swing range, e.g., from 0 V to 5 V nominal, to transistors operating at a second logic-level swing range, e.g., from 0 V to 3.3 V—or vice versa. However such translators are not limited to operation in those ranges alone. It is well known that such translators are necessary in order to provide for complete turn-on or turn-off of circuit transistors when, for example, the logic-high signal coming into the control node of a particular transistor is lower by a volt or more than the potential of the high-potential rail powering that transistor. Failure to minimize the difference between the potential of that input signal to the control node and the high-potential rail will allow that transistor to remain on when it should be off. In such a case, there exists a continuous current path when none should exist, leading to increased power dissipation. This undesirable current path is described by various names, including leakage current, static current, and quiescent current. Of course, this failure to achieve complete turn-off generally occurs in MOS transistors and PMOS transistors in particular.

One example of a translator circuit that operates independent of the power-up sequencing of the different high-potential rails and without static current ($I_{CCi}$) is described in the related application and is illustrated in FIG. 1. In that translator circuit 10, the two different high-potential rails, designated generally as $V_{CCA}$ and $V_{CCB}$, power the input stage 11 and the output stage 12, respectively, of the translator circuit 10. The translator circuit 10 provides for isolation of the two high-potential rails by eliminating any direct pathway between them. This is achieved by coupling the source nodes and the control nodes of the PMOS transistors of the output stage of the translator to the same high-potential rail rather than coupling either the source node or the control node of one or more of the output stage PMOS transistors to one of the two high-potential rails while the other of those two nodes is tied to the other high-potential rail. Through this design the gate-to-source potential difference is minimized so that the PMOS transistors of the translator circuit 10 are on when they should be on and off when they should be off. Static leakage current is thus avoided.

In order to achieve complete power supply isolation, the input stage 11 of the translator circuit 10 has a standard inverting transistor pair PA1,NA1 coupled to the first high-potential rail $V_{CCA}$ and to the common low-potential rail GND. The output stage 12 is coupled to the second high-potential rail $V_{CCB}$ and to the common GND. A data input signal $V_{IN}$ is coupled to the input stage 11. The output stage 12 includes a pullup/pulldown stage formed of a complementary transistor pair PB3, NB3. The output stage 12 also includes a first control stage and a second control stage operating in complementary fashion to control the pullup/pulldown stage and to turn completely on and completely off all PMOS transistors of the output stage 12.

The first control stage includes a first PMOS control transistor PB1 and a first NMOS control transistor NB1, wherein the control node of the first NMOS transistor is coupled to the data input signal $V_{IN}$, its source to GND, and its drain to node B tied to the control node of PB1. The source of PB1 is coupled directly to $V_{CCB}$ and its drain is tied to a node linked to the control node of the pullup transistor PB3. The second control stage includes a second PMOS control transistor PB2 and a second NMOS control transistor NB2, wherein the control node of NB2 is coupled to the data signal transmitted by the input stage 11 at node A, its source is coupled to GND, and its drain is coupled to node C tied to the control nodes of the pullup transistor PB3 and the second PMOS control transistor NB2. The source of PB2 is coupled directly to $V_{CCB}$ and its drain is tied to node B.

The related translator circuit 10 provides for the appropriate transition from the input stage 11 to the output stage 12 when the potentials of their respective high-potential rails are unequal. Further, this is accomplished without creation of static current. However, in the particular situation when the input data signal switches from logic-high to logic-low, or vice-versa, there exists a period of time within which both transistors of the pullup/pulldown stage, PB3 and NB3 are both on. With both transistors conducting simultaneously, a transient feedthrough switching current is evident in the translator circuit 10. As with the static current problem noted in earlier translators, the feedthrough switching current dissipates power in the system. While this switching current is, by its nature, transient, unlike the continuous static current, it nevertheless reduces the switching speed of the circuit and does dissipate power. Further, in devices with fast edges, this transient simultaneous conduction current can be significant enough to create noise problems in the circuit, given the speed with which load capacitances must be charged/discharged. This problem can be of particular concern in advanced MOS devices with voltage swings greater than those experienced by bipolar devices.

In the related translator circuit illustrated in FIG. 1 it can be seen that when the data signal at $V_{IN}$ switches from logic-low to logic-high, the data signal from the output $V_{OUT}$ will be switched from logic-high to logic-low. That is, pullup transistor PB3 is turned off and pulldown transistor NB3 is turned on. Under ideal conditions, PB3 would be turned off completely before NB3 is switched on. However, NB3 is coupled directly to $V_{IN}$ while PB3 is controlled through several devices that slow the signal from the output of the input stage 11. As a result, NB3 is on while PB3 is in the process of being switched off—thus producing the transient simultaneous conduction current. This transient simultaneous conduction therefore exists during this switching, regardless of the potentials of $V_{CCA}$ and $V_{CCB}$. Of course, when $V_{IN}$ switches from logic-high to logic-low there also exists a period of time when both PB3 and NB4 are off. Of course, there is no transient simultaneous conduction current in that situation.

Therefore, what is needed is a device that will minimize, or prevent, transient simultaneous conduction at the output stage of a translator circuit. Further, what is needed is a device that will minimize or eliminate transient simultaneous conduction at the output stage of a translator circuit without effecting the ability of that translator to provide translation from circuitry powered by a high-potential rail at one potential to circuitry powered by a second high-potential rail at a different potential and without static current.

SUMMARY OF THE INVENTION

It is an object of the present invention to provide a circuit that is coupled to a translator circuit and that minimizes or eliminates simultaneous conduction in that translator circuit. It is also an object of the present invention to provide such a circuit that does not create a static current pathway or that restricts the operation of the translator to particular ordering between the different high-potential power rails.

The noted objectives are achieved in the present invention by introducing a delay circuit coupled between the input $V_{IN}$ and the pulldown transistor of a translator circuit. The circuit delays the signal from $V_{IN}$ to the pulldown transistor long enough to permit the control signal to the pullup transistor of the translator circuit to act on that pullup transistor first. In this way, those transistors are prevented from being on simultaneously. It is to be understood that while the circuit of the present invention is described as being used in a particular translator circuit, it may be similarly used in other circuits requiring minimization, or elimination, of transient simultaneous conduction currents.

The circuit of the present invention includes a first transient-eliminating transistor tied to $V_{IN}$ and $V_{OUT}$, and a second transient-eliminating transistor tied to the first transient-eliminating transistor, $V_{OUT}$, and the pulldown transistor. Specifically, $V_{IN}$ is coupled directly to the control node of the first transient-eliminating transistor. The high-potential node of the first transient-eliminating transistor is coupled to $V_{OUT}$ acting as a drain of that output. The high-potential node of the first transient-eliminating transistor is also coupled to the control node of the second transient-eliminating transistor so that when the first transient-eliminating transistor is on and draining $V_{OUT}$, it turns on the second transient-eliminating transistor. In this way, the second transient-eliminating transistor is not tied directly to the first high-potential rail $V_{CCA}$. The rate at which the second transient-eliminating transistor is turned on is dependent upon the design of the first transient-eliminating transistor. The low-potential node of the second transient-eliminating transistor is coupled directly to the control node of the pulldown transistor, thereby acting as the regulating transistor for switching the pulldown transistor on and off. The high-potential node of the second transient-eliminating transistor is coupled to $V_{IN}$.

Additionally, a third transient-eliminating transistor, with its control node coupled to the output of the input stage of the translator circuit and its high-potential node coupled to the low-potential node of the second transient-eliminating transistor and to the control node of the pulldown transistor, aids in regulating the second transient-eliminating transistor and the pulldown transistor. In particular, the third transient-eliminating transistor operates, when on, to maintain the potentials of the high- and low-potential nodes of the second transient-eliminating transistor essentially equal so that that transistor will remain off when the pulldown transistor should be off. It also operates to keep the pulldown transistor off.

One optional component includable in the transient-eliminating circuit of the present invention is a regulating device that is coupled between the high- and low-potential nodes of the second transient-eliminating transistor. This regulating device reduces the propagation delay associated with the operation of the transient-eliminating circuit when the potential of $V_{CCA}$ is less than the potential of $V_{CCB}$ and $V_{IN}$ is switching from logic-low to logic-high. Under those conditions, the time required to drain $V_{OUT}$ can be relatively greater than under other conditions, given the fact that the high-potential of the pullup transistor must be overcome. The regulating device accelerates the turn-on of the pulldown transistor by providing essentially a direct pathway to $V_{IN}$, thereby circumventing the slower second transient-eliminating transistor for control of the pulldown transistor. The regulating device may be a load resistor coupled to the second transient-eliminating transistor as indicated, or it may simply be achieved through threshold adjustment of the second transient-eliminating transistor. Through the addition of the load resistor an RC time constant is set up for the pulldown transistor, so as to effect its turn-on directly via $V_{IN}$ rather than requiring it to wait for the operation of the first and second transient-eliminating transistors.

The transient-eliminating circuit of the present invention thus acts to minimize simultaneous conduction in a translator circuit. It provides this capability without introducing static current $I_{CCt}$ to the translator. These novel features and others will become apparent upon review of the detailed description of the preferred embodiment and the appended claims.

DETAILED DESCRIPTION OF THE PREFERRED EMBODIMENT OF THE PRESENT INVENTION

Figure 1:
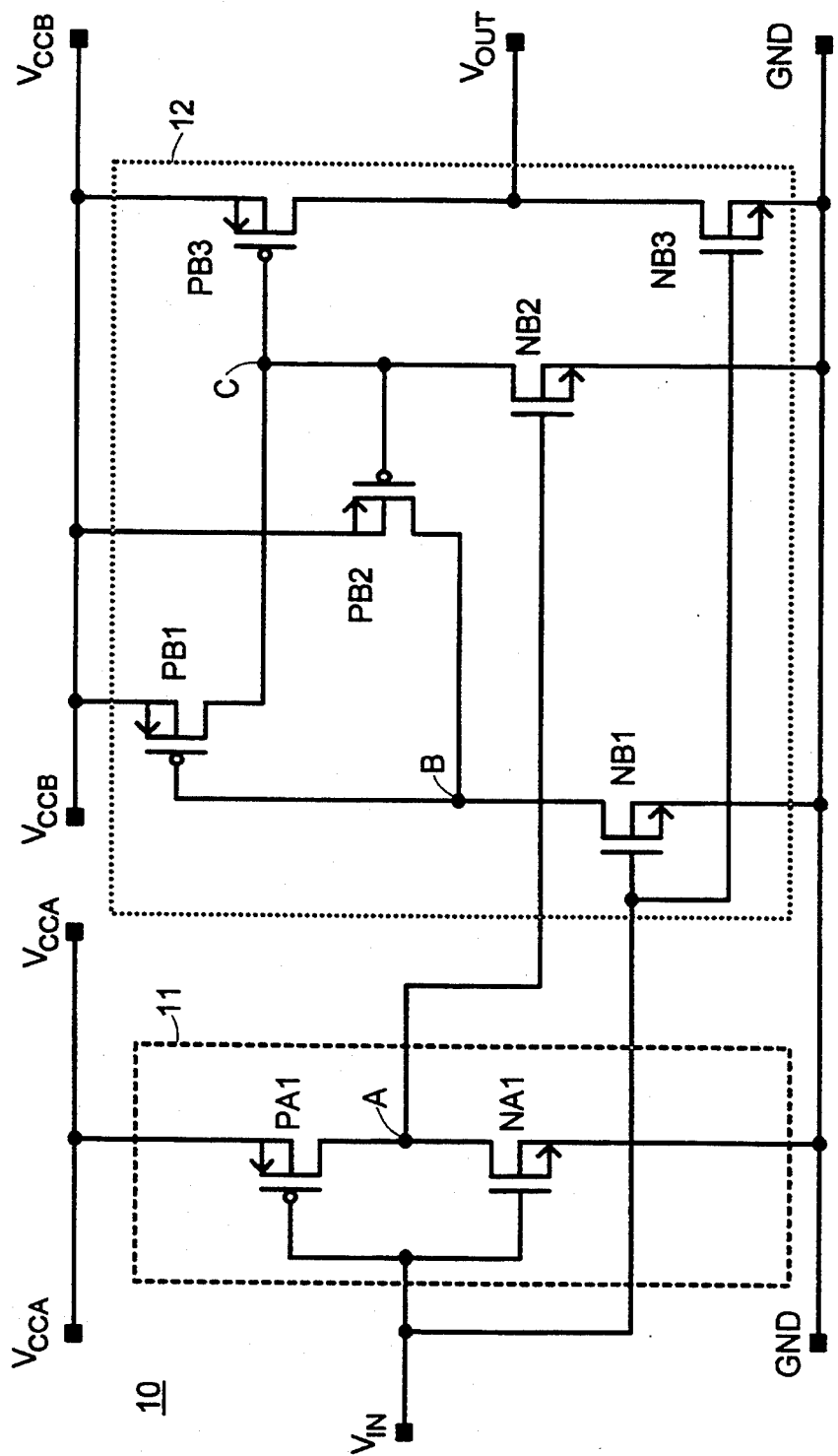
FIG. 1 is a schematic diagram of a translator of the related art.
Figure 2:
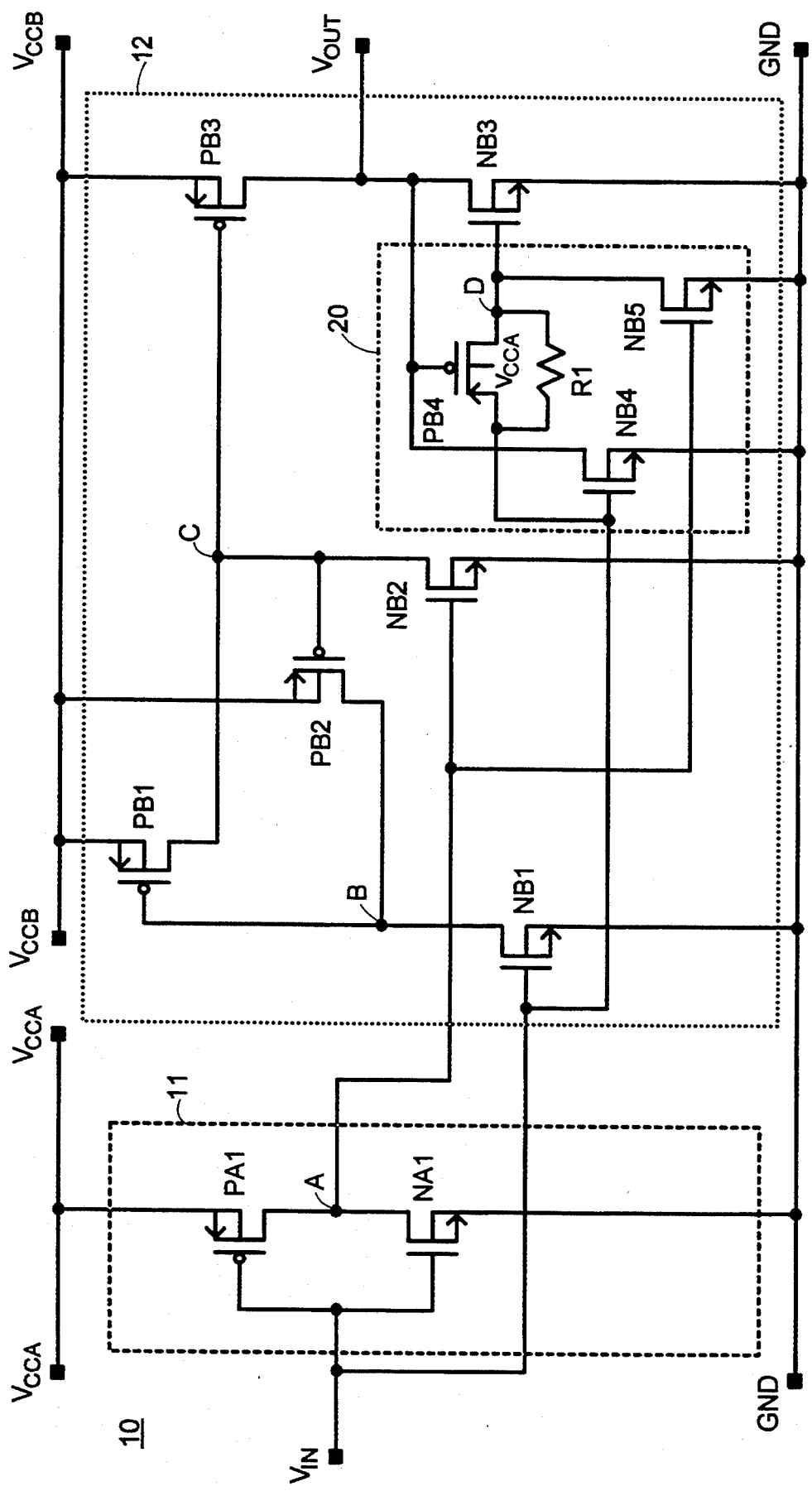
FIG. 2 is a schematic diagram of the related translator including the transient-eliminating circuit of the present invention.

The device of the present invention is a transient-eliminating circuit 20 that is coupled to an output stage 12 of an interface translator circuit 10 having an input stage 11 isolated from the output stage 12, as illustrated in FIG. 2. It is to be understood that the term "output stage" is used in this case to describe only the output of the translator circuit 10 of a buffer circuit—not an output driver to an external device. The input stage 11 and the output stage 12 are coupled to first high-potential rail $V_{CCA}$ and second high-potential rail $V_{CCB}$, respectively, in such a way that the interface translator circuit 10 operates as required regardless of the voltage levels of $V_{CCA}$ and $V_{CCB}$.

The input stage 11 of the translator circuit 10 of the present invention includes a standard inverting CMOS transistor pair, PA1,NA1, wherein a logic input $V_{IN}$ is coupled to the gates of PMOS input-stage transistor PA1 and NMOS input-stage transistor NA1. The source and the bulk of transistor PA1 are coupled directly to first high-potential rail $V_{CCA}$, and its drain is coupled to the drain of transistor NA1 at node A, which is the output node of input stage 11. The source and bulk of transistor NA1 are coupled directly to low-potential rail GND. Although the input stage 11 of the preferred embodiment of the present invention includes a single inverting transistor pair, it is to be understood that the input stage 11 may include a variety of integrated circuit devices. The key to the present invention lies in achieving the transition from the input stage 11 to the output stage 12 while also preventing simultaneous conduction in the output stage 12 when the input $V_{IN}$ switches from one logic level to another.

The output stage 12 illustrated in FIG. 2 includes three PMOS transistors and three NMOS transistors, in addition to the transient-eliminating circuit 20. The source and the bulk of first PMOS output-stage transistor PB1 are coupled directly to second high-potential rail $V_{CCB}$, its gate is coupled to the drain of first NMOS output-stage transistor NB1 and to the drain of second PMOS output-stage transistor PB2 at node B, and its drain is coupled to the drain of second NMOS output-stage transistor NB2 at node C. The source and bulk of transistor NB2 are coupled to GND, and its gate is coupled to the output of the input stage 11 at node A. The source and bulk of transistor PB2 are coupled directly to $V_{CCB}$, its drain is coupled to the gate of PB1 and to the drain of NB1 at node B, as noted. As a result, the gate of transistor PB1 is not coupled directly to the input stage 11 of the translator circuit 10 but is instead isolated by NB1. The gate of PB2 is coupled to the drain of PB1 and to the drain of NB2 at node C.

A key feature of the translator circuit 10 of the present invention is the link between the input stage 11 and the output stage 12 at node A. Specifically, node A is coupled directly to the gate of transistor NB2. In this arrangement transistor NB2 isolates the gates of PMOS output-stage transistors PB2 and PB3 from the input stage 11 of the translator circuit 10. As a result, and along with the operation of transistor NB1, the gates and the sources of all PMOS transistors of the output stage 12 are isolated from $V_{CCA}$. The source and bulk of transistor NB2 are coupled directly to GND.

Third PMOS output-stage transistor PB3 and third NMOS output-stage transistor NB3 are the pullup and pulldown transistors, respectively, of the output stage 12, with the drains of those two transistors coupled together at translator output $V_{OUT}$. As with the other output transistors, the source and bulk of PB3 are coupled directly to $V_{CCB}$, and the source and bulk of NB3 are coupled directly to GND. The gate of PB3 is coupled to the drains of transistors PB1 and NB2 at node C. The gate and drain of NB3 are coupled to the transient-eliminating circuit 20 of the present invention.

In the preferred embodiment of the present invention the transient-eliminating circuit 20 includes one PMOS transistor, designated as the fourth PMOS output-stage transistor PB4, and two NMOS transistors, designated as the fourth and fifth NMOS output-stage transistors, NB4 and NB5. Optionally, a load resistor R1 may be included in the transient-eliminating circuit 20 so as to reduce propagation delay during the $V_{IN}$ transition from logic-low to logic-high when $V_{CCB}$ is greater than $V_{CCA}$ in a manner to be described herein. The sources and bulks of transistors NB4 and NB5 are coupled directly to GND. The gate of NB4 is coupled to input $V_{IN}$ and the drain of NB4 is coupled to output $V_{OUT}$ as well as the gate of PB4. The gate of NB5 is coupled to the output node of the input stage 11 at node A, and its drain is coupled to the drain of PB4 and the gate of pulldown transistor NB3 at node D. The source of PB4 is coupled to input $V_{IN}$ and its bulk is tied to $V_{CCA}$, the controlling power rail in this instance. It is to be noted that neither the source nor the gate of PB4 is coupled directly to second high-potential rail $V_{CCB}$. In the optional design of the transient-eliminating circuit 20, load resistor R1 is coupled across the source and the drain of PB4 and in the preferred embodiment of the invention, and with the transistor sizes noted below, R1 has a resistance of 6 kilohms.

In the preferred embodiment of the present invention the channel width of pulldown transistor NB3 is approximately three to five times greater than the channel widths of the NMOS transient-eliminating transistors NB4 and NB5. Generally speaking, NB3 may have a channel width on the order of 2–10 times greater than the channel widths of transistors NB4 and NB5. Of course, the sizes of all the transistors described herein are to be set as a function of operational requirements.

In operation, when $V_{IN}$ is at logic-high (H), that is, at about the potential of first high-potential rail $V_{CCA}$, transistor PA1 is off, transistor NA1 is on, and node A is at logic-low (L), corresponding to low-potential rail GND. In addition, transistor NB1 and transistor NB4 are also on. With transistor NB1 on, node B of the output stage 12 is at logic L. With transistor NB4 on, output $V_{OUT}$ is pulled to logic L, corresponding to the potential of common low-potential rail GND, and so the gate of transistor PB4 is also at logic L; therefore it is on as well. Of course, the size of transistor NB4 will determine the rate at which $V_{OUT}$ is pulled to GND and therefore the speed with which PB4 is turned on. Transistor NB5 is off since its gate is tied to node A which is at logic L. With NB5 off and PB4 on, transistor NB3 is on so it acts to pull output $V_{OUT}$ to GND as well. Also, with transistor NB1 on, transistor PB1 is on, placing node C at logic H corresponding to the potential of second high-potential rail $V_{CCB}$, As a result, transistor PB3 is off. Finally, since node A is at logic L, transistor NB2 is off and so transistor PB2 is also off.

When $V_{IN}$ is at logic L, corresponding to low-potential rail GND, PA1 is on and node A is at logic H, corresponding to $V_{CCA}$. In addition, transistors NB1 and NB4 are off. When node A is at logic H, transistor NB2 is on, and so transistor PB2 is on as well. With transistor NB1 off and transistor PB2 on, transistor PB2 holds transistor PB1 off completely. At the same time, transistor PB3 is held on by transistor NB2, thereby maintaining output $V_{OUT}$ at logic H, corresponding to $V_{CCB}$. Transistor NB5 is on since node A is at logic H, thereby pulling node D to GND. With node D at logic L, transistor NB3 is off. Since $V_{IN}$ and node D are at GND, the source and drain of transistor PB4 are at GND, leaving it effectively off.

In the transition of $V_{IN}$ from one logic level to another; that is, from H→L or L→H, the interface translator circuit 10 of the present invention operates as required, again regardless of the voltage levels of $V_{CCA}$ and $V_{CCB}$. However, without the transient-eliminating circuit 20 of the present invention, transient simultaneous conduction may occur through transistors PB3 and NB3 during the H→L transition at $V_{OUT}$—that is, when $V_{IN}$ switches from L→H. When $V_{IN}$ switches from H→L, transistors NA1, NB1 and NB4 turn off and transistor PA1 is switched on. Node A is pulled up to logic H, corresponding to $V_{CCA}$, thereby turning transistors NB2 and NB5 on. Transistor NB5 then shuts transistor NB3 off as it pulls node D to GND. With its source and drain nodes now at the same potential, corresponding to low-potential rail GND, transistor PB4 is turned off. Continuing on, transistor NB2 switches transistor PB2 on by pulling its gate to GND; however, in order to turn transistor PB2 on, transistor NB2 must first pull node C to logic L. In addition, transistor NB2 begins to pull the gate of transistor PB3 to GND, so as to turn that transistor on as well. With transistor PB2 on, the gate of transistor PB1 is held to logic H, as that gate is tied to the drain of transistor PB2 at node B. Therefore, transistor PB1 is turned completely off, allowing transistor NB2 to pull the gate of transistor PB3 completely to GND. With transistor PB3 completely on and transistor NB3 completely off, output $V_{OUT}$ is held to logic H, corresponding to $V_{CCB}$.

In the logic-level transition of input $V_{IN}$ from L→H, transistors NA1, NB1 and NB4 are switched on and transistor PA1 is switched off. With transistor NB4 on, output $V_{OUT}$ begins to switch to low-potential rail GND. Since transistor PA1 is off and transistor NA1 is on, node A is pulled to logic L, corresponding to GND, thereby turning off transistors NB2 and NB5. Since transistor NB1 is on, the gate of transistor PB1 is pulled to GND and therefore transistor PB1 turns on. With transistor PB1 on and transistor NB2 off, transistors PB2 and PB3 are switched off, since the gates of both transistors are pulled up to the high-potential rail $V_{CCB}$. As transistor PB3 turns off, transistor NB4 continues to pull output $V_{OUT}$ down to GND. As $V_{OUT}$ continues to go to GND, transistor PB4 is switched on. Specifically, transistor PB4 is switched on when its gate is pulled to a potential equivalent to the potential at its source ($V_{IN}$) less its threshold voltage value, which is a function of the size and doping of transistor PB4. Once transistor PB4 is turned on, the gate of transistor NB3 is essentially at the potential of input $V_{IN}$, corresponding to high-potential rail $V_{CCA}$ in this particular transition. As a result, transistor NB3 is turned completely on, thereby providing enhanced pulldown on output node $V_{OUT}$ to low-potential rail GND. Through this design, simultaneous conduction through transistors PB3 and NB3 is minimized because transistors PB4 and NB4 operate to slow the turning on of pulldown transistor NB3 until pullup transistor PB3 is completely off, at which point output $V_{OUT}$ is released for switching.

One particular enhancement of the present invention may be utilized in the specific situation when $V_{IN}$ switches from L→H and first high-potential rail $V_{CCA}$ is at a potential less than the potential of second high-potential rail $V_{CCB}$, such as when $V_{CCA}$ is at 3 V nominal and $V_{CCB}$ is at 5 V nominal (or at whatever unequal potential levels they are set). It has been observed that, under these conditions, the propagation delay of the transition through the translator is increased by about one nanosecond. This increase in the propagation delay is incurred by transistors PB4 and NB4. Specifically, transistor NB4 is required to begin pulling output $V_{OUT}$ low when transistor PB3 is switching off. However, in this situation, the gate of transistor NB4 is at the potential of first high-potential rail $V_{CCA}$, or, in this specific example, at about 3 V, while its drain starts at about the potential of second high-potential rail $V_{CCB}$—about 5 V in this example. In order to reduce this propagation delay increase, a load resistor R1 may be coupled across the source and drain of PB4 so as to set up an RC time constant for transistor NB3. As result, the pulldown transistor effectively has a direct link to $V_{IN}$ by bypassing the operation of transistors PB4 and NB4, The propagation delay increase is minimized as a function of the resistance of R1 and the gate capacitance of transistor NB3. As noted, this bypass is only required during the specific transition of $V_{IN}$ from L→H when second high-potential rail $V_{CCB}$ is at a potential greater than that of first high-potential rail $V_{CCA}$. It is to be noted that for the circuit illustrated in FIG. 2, the gate capacitance of transistor NB3 is much greater than the capacitive effect provided by the other devices coupled at the source node of transistor NB3. It is also to be noted that the propagation delay in this specific situation can be reduced by adjusting the capacitance at that node through the use a discrete capacitor, rather than relying solely upon the capacitance of transistor NB3 and in addition to, or alternative to, adjusting the resistance of load resistor R1.

Although the preferred embodiment of the present invention has been described herein, the above description is merely illustrative. Further modification of the invention herein disclosed will occur to those skilled in the respective arts and all such modifications are deemed to be within the scope of the invention as defined by the appended claims.

What is claimed is:

1. A transient-eliminating translator circuit for translating a logic signal from a first circuit to a second circuit while minimizing transient simultaneous conduction current through a pullup transistor and a pulldown transistor thereof said transient-eliminating translator circuit comprising:
   a. an input stage couplable to an output of said first circuit, wherein said input stage is powered by a first high-potential power rail;
   b. an output stage couplable to an input of said second circuit, said output stage including said pull up transistor and said pulldown transistor, wherein said output stage is powered by a second high-potential power rail not equal in potential to said first high-potential power rail, said output stage having one or more PMOS output transistors, each of said one or more PMOS output transistors having a high-potential node and a control node, with said high-potential node and said control node of each of said PMOS output transistors isolated from said first high-potential power rail; and
   c. a transient-eliminating stage including a first transient-eliminating transistor and a second transient-eliminating transistor, wherein a control node of said first transient-eliminating transistor is coupled to said output of said first circuit and a high-potential node of said first transient-eliminating transistor is coupled to said input of said second circuit, and wherein a control node of said second transient-eliminating transistor is coupled to said input of said second circuit and to said high-potential node of said first transient-eliminating transistor, wherein a high-potential node of said second transient-eliminating transistor is coupled to said output of said first circuit, and wherein a low-potential node of said second transient-eliminating transistor is coupled to a control node of said pulldown transistor.

2. The transient-eliminating translator circuit as claimed in claim 1, with said input stage having an output node and said transient-eliminating translator circuit further comprising a third transient-eliminating transistor wherein a control node of said third transient-eliminating transistor is coupled to said output node of said input stage and a high-potential node of said third transient-eliminating transistor is coupled to said low-potential node of said second transient-eliminating transistor and to said control node of said pulldown transistor.

3. The transient-eliminating translator circuit as claimed in claim 2 further comprising a load-regulating device coupled between said high-potential node and said low-potential node of said second transient-eliminating transistor.

4. The transient-eliminating translator circuit as claimed in claim 3 with said load-regulating device comprising a load resistor.

5. The transient-eliminating translator circuit as claimed in claim 1 wherein said first transient-eliminating transistor is an NMOS transistor and said second transient-eliminating transistor is a PMOS transistor.

6. The transient-eliminating translator circuit as claimed in claim 2 wherein said first transient-eliminating transistor is an NMOS transistor, said second transient-eliminating transistor is a PMOS transistor and said third transient-eliminating transistor is an NMOS transistor.

7. A transient-eliminating translator circuit for translating a logic signal from a first circuit to a second circuit while minimizing transient simultaneous conduction current through a PMOS pullup transistor and an NMOS pulldown transistor thereof said transient-eliminating translator circuit comprising:
 a. an input stage couplable to an output of said first circuit, wherein said input stage is powered by a first high-potential power rail;
 b. an output stage couplable to an input of said second circuit, said output stage including said PMOS pullup transistor and said NMOS pulldown transistor, wherein said output stage is powered by a second high-potential power rail not equal in potential to said first high-potential power rail, said output stage having one or more PMOS output transistors, each of said one or more PMOS output transistors having a high-potential node and a control node, with said high-potential node and said control node of each of said PMOS output transistors isolated from said first high-potential power rail; and
 c. a transient-eliminating circuit having:
  i. a first NMOS transient-eliminating transistor having a gate coupled to said output of said first circuit and a source coupled to a low-potential power rail;
  ii. a PMOS transient-eliminating transistor having a gate coupled to a drain of said first NMOS transient-eliminating transistor and to said input of said second circuit, a source coupled to said output of said first circuit, and a drain coupled to a gate of said NMOS pulldown transistor; and
  iii. a second NMOS transient-eliminating transistor having a gate coupled to an output node of said input stage, a source coupled to said low-potential power rail, and a drain coupled to said drain of said PMOS transient-eliminating transistor and to said gate of said NMOS pulldown transistor.

8. The transient-eliminating translator circuit as claimed in claim 7 further comprising a load resistor coupled between said source and said drain of said PMOS transient-eliminating transistor.

9. A transient-eliminating circuit for minimizing simultaneous conduction through a pullup transistor and a pulldown transistor of a translator circuit, said translator circuit for translating a logic signal from a first circuit to a second circuit, said translator circuit having an input stage coupled to an output of said first circuit and powered by a first high-potential power rail, and an output stage having an input coupled to an output of said input stage, an output coupled to said second circuit, and powered by a second high-potential power rail, wherein the potential of said first high-potential rail is not equal to the potential of said second high-potential rail, said output stage comprising:
 (a) a first NMOS output-stage transistor having a gate coupled to said output of said first circuit and a source coupled to a low-potential power rail;
 (b) a second NMOS output-stage transistor having a gate coupled to said output of said input stage and a source coupled to said low-potential power rail;
 (c) a third NMOS output-stage transistor having a gate coupled to said output of said first circuit and a source coupled to said low-potential power rail;
 (d) a first PMOS output-stage transistor having a gate coupled to the drain of said first NMOS output-stage transistor, a source coupled to said second high-potential power rail, and a drain coupled to the drain of said second NMOS output-stage transistor;
 (e) a second PMOS output-stage transistor having a gate coupled to the drains of said first output-stage PMOS transistor and said second NMOS output-stage transistor, a source coupled to said second high-potential power rail, and a drain coupled to the drain of said first NMOS output-stage transistor; and
 (f) a third PMOS output-stage transistor having a gate coupled to the drains of said first PMOS output-stage transistor and said second NMOS output-stage transistor, a source coupled to said second high-potential power rail, and a drain coupled to the input of said second circuit,
 and said transient-eliminating circuit comprising:
 (a) a first NMOS transient-eliminating transistor having a gate coupled to said output of said first circuit and a source coupled to said low-potential power rail;
 (b) a PMOS transient-eliminating transistor having a gate coupled to a drain of said first NMOS transient-eliminating transistor and to said input of said second circuit, a source coupled to said output of said first circuit, and a drain coupled to a gate of said third NMOS output-stage transistor; and (c) a second NMOS transient-eliminating transistor having a gate coupled to said output of said input stage, a source coupled to said low-potential power rail, and a drain coupled to said drain of said PMOS transient-eliminating transistor and to said gate of said third NMOS output-stage transistor.

10. The transient-eliminating circuit as claimed in claim 9 further comprising a load resistor coupled between said source and said drain of said PMOS transient-eliminating transistor.

11. A method for eliminating transient simultaneous conduction current through a pullup transistor and a pulldown transistor of a translator circuit, said translator circuit for translating a logic signal from a first circuit to a second circuit, said method comprising the steps of:

(a) coupling a translator input stage to an output of said first circuit, wherein said translator input stage is powered by a first high-potential power rail;

(b) coupling a translator output stage to an output of said translator input stage and to an input of said second circuit, wherein said output stage is powered by a second high-potential power rail not equal to the potential of said first high-potential power rail, and wherein said translator output stage includes said pullup transistor and said pulldown transistor;

(c) isolating gate and source nodes of one or more PMOS transistors of said translator output stage from said first high-potential power rail;

(d) coupling a control node of a first transient-eliminating transistor to said output of said first circuit and coupling a high-potential node of said first transient-eliminating transistor to said input of said second circuit; and (e) coupling a control node of a second transient-eliminating transistor to said input of said second circuit and to said high-potential node of said first transient-eliminating transistor, coupling a high-potential node of said second transient-eliminating transistor to said output of said first circuit, and coupling a low-potential node of said second transient-eliminating transistor to a control node of said pulldown transistor.

12. The method as claimed in claim 11 further comprising the step of coupling a control node of a third transient-eliminating transistor to said output of said translator input stage and coupling a high-potential node of said third transient-eliminating transistor to said low-potential node of said second transient-eliminating transistor and to said pulldown transistor.

13. The method as claimed in claim 12 further comprising the step of coupling a load-regulating device between said high-potential node and said low-potential node of said second transient-eliminating transistor.

14. The method as claimed in claim 13 with said load-regulating device comprising a resistor.

15. The method as claimed in claim 12 wherein said first transient-eliminating transistor is an NMOS transistor and said second transient-eliminating transistor is a PMOS transistor.

16. The method as claimed in claim 15 wherein said third transient-eliminating transistor is an NMOS transistor.

* * * * *